(12) United States Patent
Wang

(10) Patent No.: US 10,326,433 B2
(45) Date of Patent: Jun. 18, 2019

(54) CLOCK FILTER AND CLOCK PROCESSING METHOD

(71) Applicant: Nuvoton Technology Corporation, Hsinchu Science Park (TW)

(72) Inventor: Chun-Cheng Wang, New Taipei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/135,717

(22) Filed: Sep. 19, 2018

(65) Prior Publication Data

US 2019/0089339 A1    Mar. 21, 2019

(30) Foreign Application Priority Data

Sep. 19, 2017    (TW) .............................. 106132093 A

(51) Int. Cl.
| | |
|---|---|
| *H03K 5/1252* | (2006.01) |
| *H03K 23/40* | (2006.01) |
| *H03K 3/027* | (2006.01) |
| *G01R 29/02* | (2006.01) |

(52) U.S. Cl.
CPC ........... *H03K 5/1252* (2013.01); *G01R 29/02* (2013.01); *H03K 3/027* (2013.01); *H03K 23/40* (2013.01)

(58) Field of Classification Search
CPC combination set(s) only.
See application file for complete search history.

(56) References Cited

U.S. PATENT DOCUMENTS

| | | | |
|---|---|---|---|
| 6,222,791 B1 | 4/2001 | Becker et al. | |
| 6,661,262 B1 | 12/2003 | Curran | |
| 7,592,843 B1 | 9/2009 | Fong | |
| 8,264,267 B2 | 9/2012 | Jung | |
| 8,913,441 B2 | 12/2014 | Minz | |
| 2006/0082391 A1* | 4/2006 | Hsu ...................... | H03K 5/1252 327/34 |

FOREIGN PATENT DOCUMENTS

| | | |
|---|---|---|
| CN | 102073008 A | 5/2011 |
| TW | I359345 B | 3/2012 |

* cited by examiner

*Primary Examiner* — Daniel C Puentes
(74) *Attorney, Agent, or Firm* — Muncy, Geissler, Olds & Lowe, P.C.

(57) ABSTRACT

A clock filter filtering a glitch of an input clock to generate an output clock is provided. A first delay circuit inverts the input clock to generate an inverted clock and delays the inverted clock to generate a first processing clock. A second delay circuit delays the input clock to generate a second processing clock. A first setting circuit generates a reset clock according to the inverted clock and the first processing clock. A second setting circuit generates a set clock according to the input clock and the second processing clock. When the set clock changes from a first level to a second level, a third setting circuit sets the output clock at the second level. When the reset clock changes from the first level to the second level, the third setting circuit sets the output clock to the first level.

16 Claims, 8 Drawing Sheets

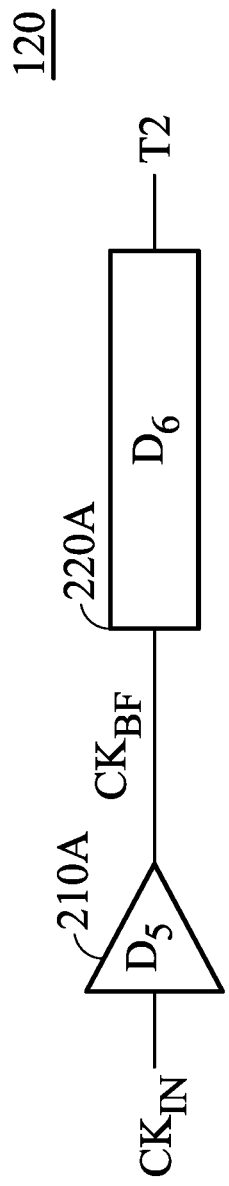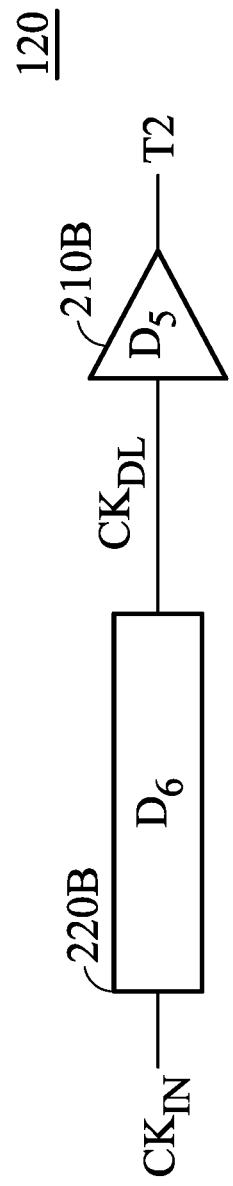
FIG. 2A
FIG. 2B

CLOCK FILTER AND CLOCK PROCESSING METHOD

CROSS REFERENCE TO RELATED APPLICATIONS

This Application claims priority of Taiwan Patent Application No. 106132093, filed on Sep. 19, 2017, the entirety of which is incorporated by reference herein.

BACKGROUND OF THE INVENTION

Field of the Invention

The invention relates to a clock filter, and more particularly to a clock filter that filters a glitch in a clock signal.

Description of the Related Art

As technology has developed, there has been an increase in the number of different types of electronic devices available on the commercial market, and the functionality of these electronic devices has likewise increased. For example, each personal computer comprises at least one clock generator. The clock generator is configured to provide various clock signals to control the circuits that are disposed in the personal computer. However, when noise interferes with the clock generator disposed in the personal computer, glitches may occur in the clock signals generated by the clock generator. When the clock signals having glitches are provided to the circuits disposed in the personal computer, the circuits may generate errors in their output.

BRIEF SUMMARY OF THE INVENTION

In accordance with an embodiment, a clock filter filters a glitch of an input clock to generate an output clock and comprises a first delay circuit, a second delay circuit, a first setting circuit, a second setting circuit and a third setting circuit. The first delay circuit inverts the input clock to generate an inverted clock and delays the inverted clock to generate a first processing clock. The second delay circuit delays the input clock to generate a second processing clock. The first setting circuit generates a reset clock according to the inverted clock and the first processing clock. The second setting circuit generates a set clock according to the input clock and the second processing clock. The third setting circuit generates the output clock according to the set clock and the reset clock. In response to the set clock changing from a first level to a second level, the third setting circuit sets the output clock to the second level. In response to the reset clock changing from the first level to the second level, the third setting circuit sets the output clock to the first level.

In one embodiment, the first delay circuit has a first delay time, the second delay circuit has a second delay time, and the first delay time is equal to the second delay time.

In another embodiment, the first delay circuit comprises an inverter and a first delayer. The inverter inverts the input clock to generate the inverted clock. The first delayer delays the inverted clock to generate the first processing clock.

In one embodiment, the second delay circuit comprises a buffer and a second delayer. The buffer receives the input clock to generate a buffered clock. The second delayer delays the buffered clock to generate the second processing clock.

In other embodiments, the first delayer has a first delay time, the second delayer has a second delay time, and each of the first and second delay times is less than or equal to a half cycle of the input clock.

In another embodiment, the second delay circuit comprises a second delayer and a buffer. The second delayer delays the input clock to generate a delayed clock. The buffer buffers the delayed clock to generate the second processing clock.

In one embodiment, in response to the inverted or the first processing clock being at the first level, the first setting sets the reset clock at the first level. In response to the inverted clock and the first processing clock being at the second level, the first setting circuit sets the reset clock at the second level.

In another embodiment, in response to the input clock or the second processing clock being at the first level, the second setting circuit sets the set clock at the first level. In response to the input clock and the second clock being at the second level, the second setting circuit sets the set clock at the second level.

In one embodiment, the third setting circuit is a SR flip-flop.

In another embodiment, the third setting circuit comprises a first NOR gate and a second NOR. The first NOR gate generates a logic signal according to the set clock and the output clock. The second NOR gate generates the output clock according to the logic signal and the reset clock.

In accordance with a further embodiment, a clock processing method to filter a glitch of an input clock and generate an output clock comprises inverting the input clock to generate an inverted signal; delaying the inverted clock to generate a first processing clock; delaying the input clock to generate a second processing clock; generating a reset clock according to the level of the inverted clock and the level of the first processing clock; generating a set clock according to the level of the input clock and the level of the second processing clock; and generating the output clock according to the set clock and the reset clock, wherein in response to the set clock changing from a first level to a second level, the output clock is at the second level, and wherein in response to the reset clock changing from the first level to the second level, the output clock is at the first level.

In one embodiment, the first processing clock lags the inverted clock and the time difference between the first processing clock and the inverted clock is equal to the first delay time. The second processing clock lags the input clock and the time difference between the second processing clock and the input clock is equal to the second delay time. The first delay time is equal to the second delay time.

In another embodiment, the step of delaying the input clock to generate the second processing clock comprises buffering the input clock to generate a buffered clock; and delaying the buffered clock to generate the second processing clock.

In other embodiments, the time difference between the first processing clock and the inverted clock is equal to the first delay time, the time difference between the second processing clock and the buffered clock is equal to the second delay time, and the first and second delay times are less than or equal to a half cycle of the input clock.

In one embodiment, in response to the inverted clock or the first processing clock being at the first level, the reset clock is at the first level, and in response to the inverted clock and the first processing clock being at the second level, the reset clock is at the second level.

In another embodiment, in response to the input clock or the second processing clock being at the first level, the set clock is at the first level, and in response to the input clock and the second processing clock being at the second level, the set clock is at the second level.

Clock processing methods may be practiced by the systems which have hardware or firmware capable of performing particular functions and may take the form of program code embodied in a tangible media. When the program code is loaded into and executed by an electronic device, a processor, a computer or a machine, the electronic device, the processor, the computer or the machine becomes an apparatus for practicing the disclosed method.

BRIEF DESCRIPTION OF THE DRAWINGS

The invention can be more fully understood by referring to the following detailed description and examples with references made to the accompanying drawings, wherein:

FIG. 2A is a schematic diagram of an exemplary embodiment of a delay circuit, according to various aspects of the present disclosure.

FIG. 2B is a schematic diagram of another exemplary embodiment of the delay circuit, according to various aspects of the present disclosure.

DETAILED DESCRIPTION OF THE INVENTION

Figure 1:
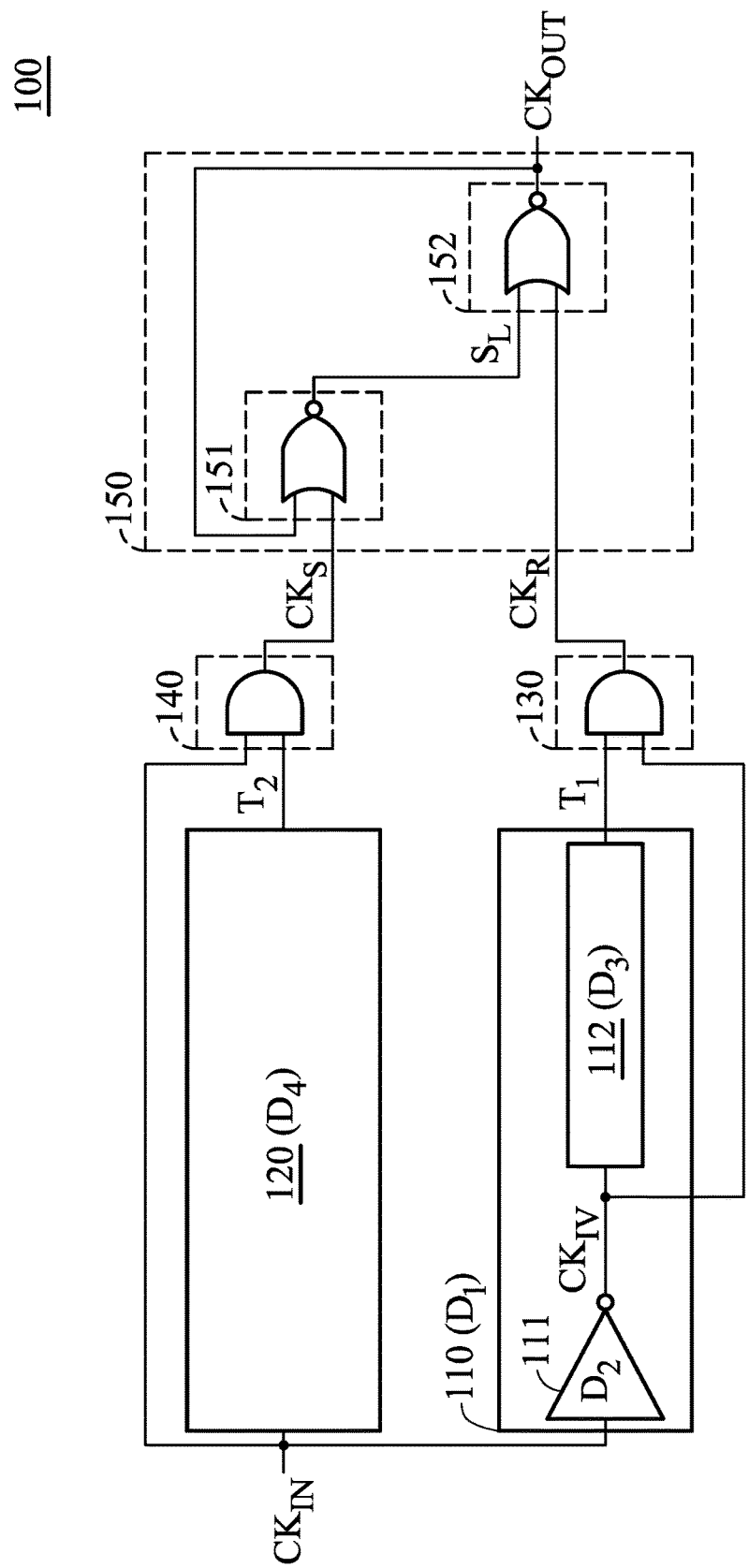
FIG. 1 is a schematic diagram of an exemplary embodiment of a clock filter, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a clock filter, according to various aspects of the present disclosure. The clock filter 100 is configured to filter a glitch of an input clock $CK_{IN}$ to generate an output clock $CK_{OUT}$. In one embodiment, the clock filter 100 is capable of integrating into an integrated circuit (IC). Furthermore, the source providing the input clock $CK_{IN}$ is not limited in the present disclosure. In one embodiment, the input clock $CK_{IN}$ is provided from a clock generator (not shown) or a clock oscillator (not shown). In this embodiment, the clock filter 100 comprises delay circuits 110 and 120, and the setting circuits 130, 140 and 150.

The delay circuit 110 inverts the input clock $CK_{IN}$ to generate an inverted clock $CK_{IV}$ and delays the inverted clock $CK_{IV}$ to generate a processing clock T1. In this embodiment, the delay circuit 110 has a delay time $D_1$. When the delay circuit 110 receives the input clock $CK_{IN}$, the delay circuit 110 generates the processing clock T1 after the delay time $D_1$. Therefore, the processing clock T1 lags the input clock $CK_{IN}$, and the time difference between the processing clock T1 and the input clock $CK_{IN}$ is equal to the delay time $D_1$. The internal circuit structure of the delay circuit 110 is not limited in the present disclosure. In one embodiment, the delay circuit 110 comprises an inverter 111 and a delayer 112.

The inverter 111 inverts the input clock $CK_{IN}$ to generate the inverted clock $CK_{IV}$. In this embodiment, the inverter 111 has delay time $D_2$. When the inverter 111 receives the input clock $CK_{IN}$, the inverter 111 generate the inverted clock $CK_{IV}$ after the delay time $D_2$. Therefore, the inverted clock $CK_{IV}$ lags the input clock $CK_{IN}$, and the time difference between the inverted clock $CK_{IV}$ and the input clock $CK_{IN}$ is equal to the delay time $D_2$.

The delayer 12 delays the inverted clock $CK_{IV}$ to generate the processing clock T1. In this embodiment, the delayer 112 has delay time $D_3$. When the delayer 112 receives the inverted clock $CK_{IV}$, the delayer 112 generates the processing clock T1 after the delay time $D_3$. Therefore, the processing clock T1 lags the inverted clock $CK_{IV}$, and the time difference between the processing clock T1 and the inverted clock $CK_{IV}$ is equal to the delay time $D_3$. In one embodiment, the delay time $D_3$ is less than or equal to a half cycle of the input clock $CK_{IN}$. In other embodiments, the sum of the delay time $D_2$ and $D_3$ may be equal to the delay time $D_1$. Furthermore, the circuit structure of the delayer 112 is not limited in the disclosure. Any circuit can serve as the delayer 112, as long as the circuit is capable delaying the inverted clock $CK_{IV}$.

The delay circuit 120 delays the input clock $CK_{IN}$ to generate a processing clock T2. In this embodiment, the delay circuit 120 has delay time $D_4$. When the delay circuit 120 receives the input clock $CK_{IN}$, the delay circuit 120 generates the processing clock T2 after the delay time $D_4$. Therefore, the processing clock T2 lags the input clock $CK_{IN}$, and the time difference between the processing clock T2 and the input clock $CK_{IN}$ is equal to the delay time $D_4$. The disclosure does not limit the circuit structure of the delay circuit 120. Any circuit can serve as the delay circuit 120, as long as the circuit is capable of delaying the input clock $CK_{IN}$.

The setting circuit 130 generates a reset clock $CK_R$ according to the level of the inverted clock $CK_{IV}$ and the level of the processing clock T1. In one embodiment, when the inverted clock $CK_{IV}$ or the processing clock T1 is at a first level, the setting circuit 130 sets the reset clock $CK_R$ at a first level. When each of the inverted clock $CK_{IV}$ and the processing clock T1 are at a second level, the setting circuit 130 sets the reset clock $CK_R$ at the second level. In this embodiment, the first level is opposite to the second level. For example, the first level is a low level, and the second level is a high level. In another embodiment, the first level is a high level, and the second level is a low level. In this embodiment, the setting circuit 130 is a AND gate.

The setting circuit 140 generates a set clock $CK_S$ according to the level of the input clock $CK_{IN}$ and the level of the processing clock T2. In one embodiment, when the input clock $CK_{IN}$ or the processing clock T2 is at a first level, the setting circuit 140 sets the set clock $CK_S$ at the first level. When each of the input clock $CK_{IN}$ and the processing clock T2 is at a second level, the setting circuit 140 sets the set clock $CK_S$ at the second level. In one embodiment, the setting circuit 140 is a AND gate.

The setting circuit 150 generates the output clock $CK_{OUT}$ according to the set clock $CK_S$ and the reset clock $CK_R$. when the set clock $CK_S$ is changed from a first level to a second level, the setting circuit 150 sets the output clock $CK_{OUT}$ from the first level to the second level and maintains the set clock $CK_S$ at the second level. When the reset clock $CK_R$ is changed from the first level to the second level, the setting circuit 150 resets the output clock $CK_{OUT}$ such that the output clock $CK_{OUT}$ is changed from the second level to the first level and maintained at the first level.

The circuit structure of the setting circuit 150 is not limited in the present disclosure. In one embodiment, the setting circuit 150 is a SR flip-flop. The set input of the SR flip-flop receives the set clock $CK_S$. The reset input of the SR flip-flop receives the reset clock $CK_R$. The output signal of the SR flip-flop is provided as the output clock $CK_{OUT}$. In this case, the SR flip-flop sets the output clock $CK_{OUT}$ at a high level according to the rising edge of the set clock $CK_S$ and resets the output clock $CK_{OUT}$ to a low level according to the reset clock $CK_R$.

In this embodiment, the setting circuit 150 comprises logic circuits 151 and 152. The logic circuit 151 generates a logic signal $S_L$ according to the set clock $CK_S$ and output clock $CK_{OUT}$. When one of the set clock $CK_S$ and the output clock $CK_{OUT}$ is at a second level (e.g. a high level), the logic signal $S_L$ is at a first level (e.g. a low level). When each of the set clock $CK_S$ and the output clock $CK_{OUT}$ is at the first level (e.g. a low level), the logic signal $S_L$ is at the second level (e.g. a high level). In one embodiment, the logic circuit 151 is a NOR gate.

The logic circuit 152 generates the output clock $CK_{OUT}$ according to the logic signal $S_L$ and the reset clock $CK_R$. For example, when the logic signal $S_L$ or the reset clock $CK_R$ is at a second level (e.g. a high level), the output clock $CK_{OUT}$ is at a first level (e.g. a low level). When each of the logic signal $S_L$ and the reset clock $CK_R$ is at the first level, the output clock $CK_{OUT}$ is at the second level. In one embodiment, the logic circuit 152 is a NOR gate.

FIG. 2A is a schematic diagram of an exemplary embodiment of the delay circuit 120, according to various aspects of the present disclosure. The delay circuit 120 comprises a buffer 210A and a delayer 220A. The buffer 210A receives the input clock $CK_{IN}$ to generate a buffered clock $CK_{BF}$. In this embodiment, the buffer 210A has a delay time $D_5$. When the buffer 210A receives the input clock $CK_{IN}$, the buffer 210A generates the buffered clock $CK_{BF}$ after the delay time $D_5$. Therefore, the buffered clock $CK_{BF}$ lags the input clock $CK_{IN}$, and the time difference between the buffered clock $CK_{BF}$ and the input clock $CK_{IN}$ is equal to the delay time $D_5$.

The delayer 220A delays the buffered clock $CK_{BF}$ to generate the processing clock T2. In this embodiment, the delayer 220A has delay time $D_6$. When the delayer 220A receives the buffered clock $CK_{BF}$, the delayer 220A generates the processing clock T2 after the delay time $D_6$. Therefore, the processing clock T2 lags the buffered clock $CK_{BF}$, and the time difference between the processing clock T2 and the buffered clock $CK_{BF}$ is equal to the delay time $D_6$. In one embodiment, the delay time $D_6$ is less than or equal to a half cycle of the input clock $CK_{IN}$. In other embodiments, the delay time $D_6$ may be equal to the delay time $D_3$ of the delayer 112 shown in FIG. 1.

FIG. 2B is a schematic diagram of another exemplary embodiment of the delay circuit, according to various aspects of the present disclosure. In this embodiment, the delayer 220B delays the input clock $CK_{IN}$ to generate a delayed clock $CK_{DL}$. In this embodiment, the delayer 220B has delay time $D_6$. When the delayer 220B receives the input clock $CK_{IN}$, the delayer 220B generates the delayed clock $CK_{DL}$ after the delay time $D_6$. Therefore, the delayed clock $CK_{DL}$ lags the input clock $CK_{IN}$, and the time difference between the delayed clock $CK_{DL}$ and the input clock $CK_{IN}$ is equal to the delay time $D_6$.

The buffer 210B buffers the delayed clock $CK_{DL}$ to generate the processing clock T2. In this embodiment, the buffer 210B has delay time $D_5$. When the buffer 210B receives the delayed clock $CK_{DL}$, the buffer 210 generates the processing clock T2 after the delay time $D_5$. Therefore, the processing clock T2 lags the delayed clock $CK_{DL}$, and the time difference between the processing clock T2 and the delayed clock $CK_{DL}$ is equal to the delay time $D_5$. In other embodiments, the buffer 210B is capable of integrating into the delayer 220B.

Figure 3:
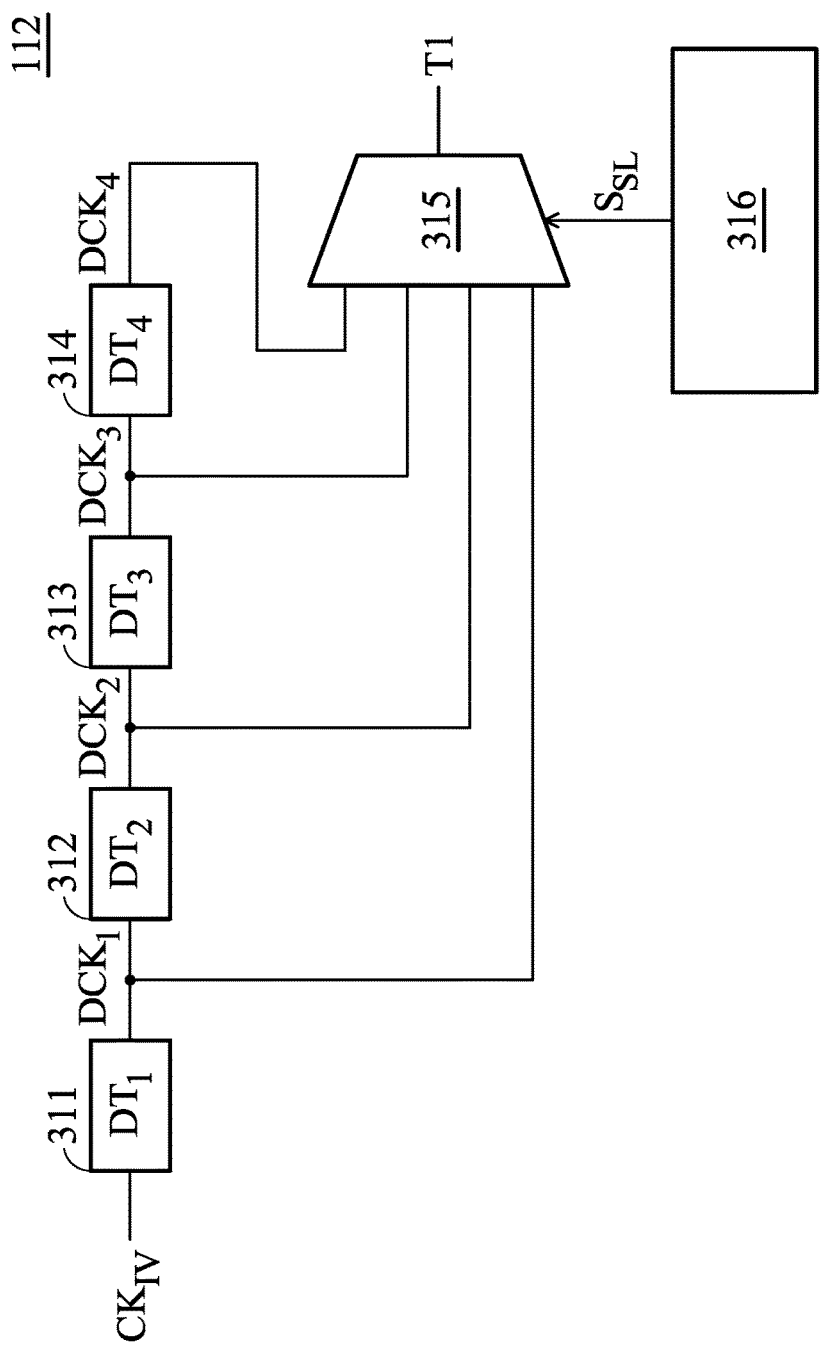
FIG. 3 is a schematic diagram of an exemplary embodiment of a delayer shown in FIG. 1, according to various aspects of the present disclosure.

FIG. 3 is a schematic diagram of an exemplary embodiment of a delayer shown in FIG. 1, according to various aspects of the present disclosure. As shown in FIG. 3, the delayer 112 comprises delay units 311~314, a selector 315, and a controller 316. The delay units 311~314 are connected in series with one another. The number of delay units is not limited thereto. In other embodiments, the delayer 112 may be comprise more delay units or fewer delay units.

The delay unit 311 delays the inverted clock $CK_{IV}$ to generate a delayed clock $DCK_1$. In this embodiment, the delay unit 311 has delay time $DT_1$. When the delay unit 311 receives the inverted clock $CK_{IV}$, the delay unit 311 generates the delayed clock $DCK_1$ after the delay time $DT_1$. Therefore, the time difference between the delayed clock $DCK_1$ and the inverted clock $CK_{IV}$ is equal to the delay time $DT_1$.

The delay unit 312 delays the delayed clock $DCK_1$ to generate a delayed clock $DCK_2$. In this embodiment, the delay unit 312 has delay time $DT_2$. When the delay unit 312 receives the delayed clock $DCK_1$, the delay unit 312 generates the delayed clock $DCK_2$ after the delay time $DT_2$. Therefore, the time difference between the delayed clock $DCK_1$ and delayed clock $DCK_2$ is equal to the delay time $DT_2$.

The delay unit 313 delays the delayed clock $DCK_2$ to generate a delayed clock $DCK_3$. In this embodiment, the delay unit 313 has delay time $DT_3$. When the delay unit 313 receives the delayed clock $DCK_2$, the delay unit 313 generates the delayed clock $DCK_3$ after the delay time $DT_3$. Therefore, the time difference between the delayed clock $DCK_2$ and delayed clock $DCK_3$ is equal to the delay time $DT_3$.

The delay unit 314 delays the delayed clock $DCK_3$ to generate a delayed clock $DCK_4$. In this embodiment, the delay unit 314 has delay time $DT_4$. When the delay unit 314 receives the delayed clock $DCK_3$, the delay unit 314 generates the delayed clock $DCK_4$ after the delay time $DT_4$. Therefore, the time difference between the delayed clock $DCK_3$ and delayed clock $DCK_4$ is equal to the delay time $DT_4$. In one embodiment, the delay time $DT_1$~$DT_4$ are equal to each other. In another embodiment, one of the delay time $DT_1$~$DT_4$ is not equal to another of the delay time $DT_1$~$DT_4$.

The selector 315 receives the delayed clocks $DCK_1$~$DCK_4$ and selects and outputs one of the delayed clocks $DCK_1$~$DCK_4$ according to a selection signal $S_{SEL}$. In this embodiment, the output signal of the selector 315 is provided as the processing clock T1. The circuit structure of the selector 315 is not limited in the present disclosure. In one embodiment, the selector 315 is a multiplexer.

The controller 316 generates the selection signal $S_{SL}$ according to a predetermined value. In one embodiment, the controller 316 comprises a register (not shown) to store the predetermined value. In another embodiment, the predetermined value is stored in an external memory (not shown). In this case, the external memory is outside of the controller 316 or outside of the delayer 112. In other embodiments, the controller 316 may be disposed outside of the delayer 112.

Figure 4A:
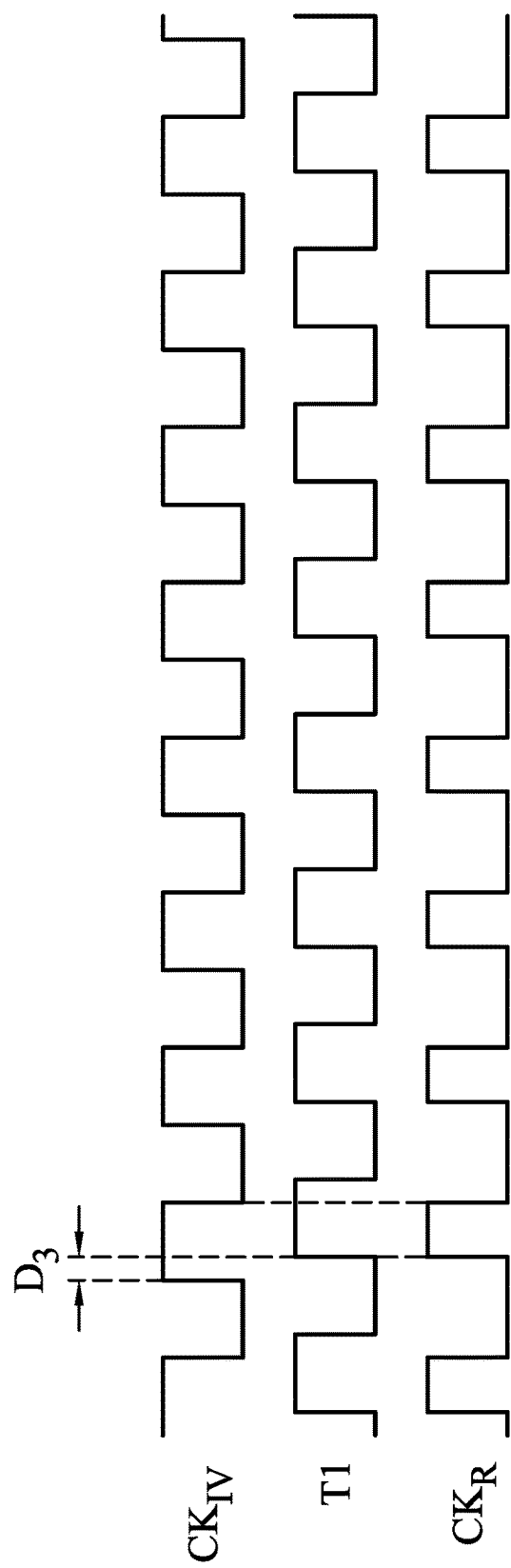
FIG. 4A is a schematic diagram of an exemplary embodiment of a setting circuit, according to various aspects of the present disclosure.

FIG. 4A is a schematic diagram of an exemplary embodiment of a setting circuit, according to various aspects of the present disclosure. When each of the inverted clock $CK_{IV}$ and the processing clock T1 is at a second level (e.g. a high level), the reset clock $CK_R$ is at the second level. In this case, when the inverted clock $CK_{IV}$ or the processing clock T1 is at a first level (e.g. a low level), the reset clock $CK_R$ is at the first level. In other embodiments, the first level is a high level, and the second level is a low level.

In this embodiment, the processing clock T1 lags the inverted clock $CK_{IV}$, and the time difference between the processing clock T1 and the inverted clock $CK_{IV}$ is equal to the delay time $D_3$. In this embodiment, the delay time $D_3$ is less than or equal to a half cycle of the inverted clock $CK_{IV}$, wherein the cycle of the inverted clock $CK_{IV}$ is equal to the cycle of the input clock $CK_{IN}$. In another embodiment, the delay time $D_3$ is approximately equal to a half cycle of the inverted clock $CK_{IV}$. In other embodiments, the delay time $D_3$ is approximately equal to a quarter cycle of the inverted clock $CK_{IV}$.

Figure 4B:
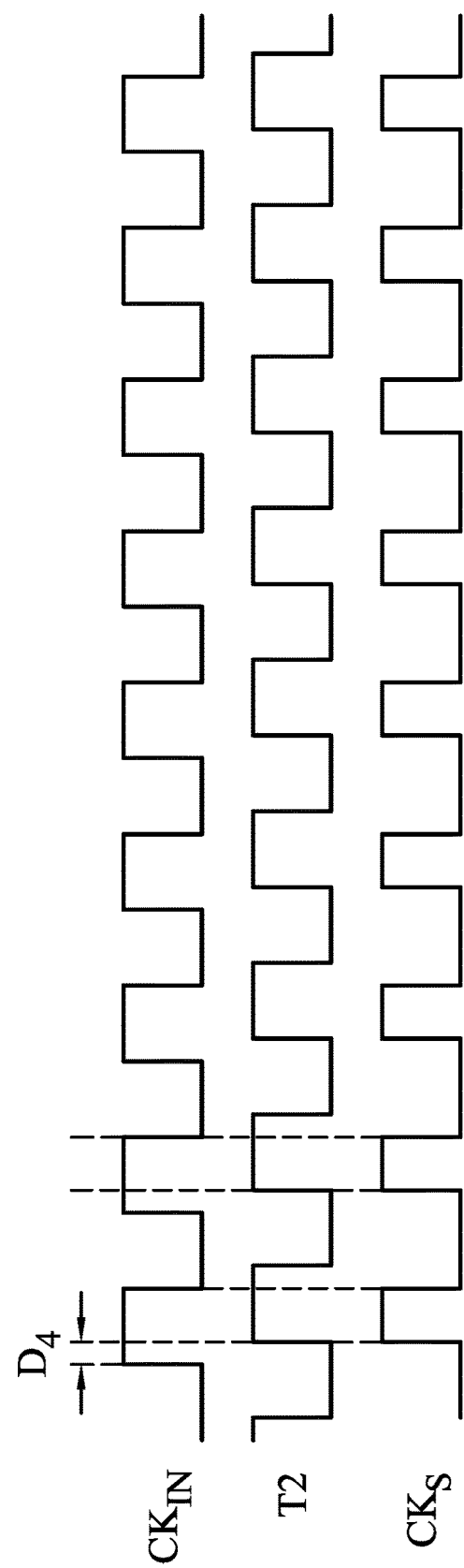
FIG. 4B is a schematic diagram of another exemplary embodiment of a setting circuit, according to various aspects of the present disclosure.

FIG. 4B is a schematic diagram of another exemplary embodiment of a setting circuit, according to various aspects of the present disclosure. When each of the input clock $CK_{IN}$ and the processing clock T2 is at a second level (e.g. a high level), the set clock $CK_S$ is at the second level. In this case, when the input clock $CK_{IN}$ or the processing clock T2 is at a first level (e.g. a low level), the set clock $CK_S$ is at the first level. In this embodiment, the first level is a low level, and the second level is a high level, but the disclosure is not limited thereto. In other embodiments, the first level is a high level, and the second level is a low level.

In this embodiment, the processing clock T2 lags the input clock $CK_{IN}$, and the time difference between the processing clock T2 and the input clock $CK_{IN}$ is equal to the delay time $D_4$. In this embodiment, the delay time $D_4$ is less than or equal to a half cycle of the input clock $CK_{IN}$. In another embodiment, the delay time $D_4$ is approximately equal to a half cycle of the input clock $CK_{IN}$.

Figure 4C:
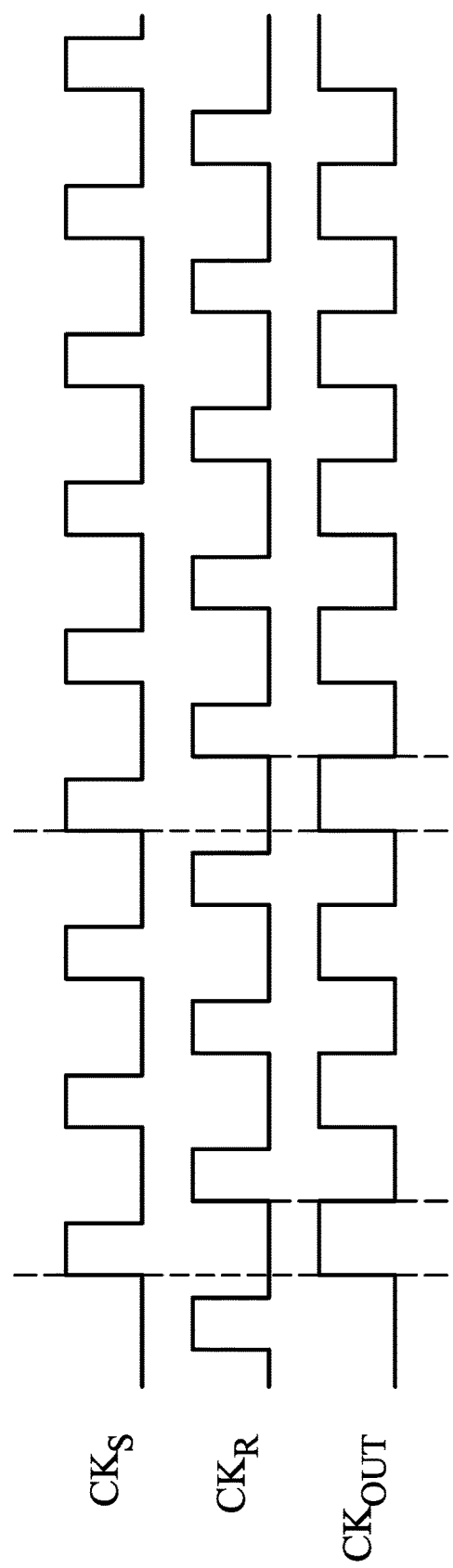
FIG. 4C is an operation diagram of an exemplary embodiment of the setting circuit, according to various aspects of the present disclosure.

FIG. 4C is an operation diagram of an exemplary embodiment of the setting circuit, according to various aspects of the present disclosure. In this embodiment, the rising edge of the set clock $CK_S$ is configured to set the setting circuit 150 such that the setting circuit 150 changes the level of the output clock $CK_{OUT}$ from a first level to a second level and maintains the output clock $CK_{OUT}$ at the second level. Additionally, the rising edge of the reset clock $CK_R$ is configured to control the setting circuit 150 such that the setting circuit 150 changes the output clock $CK_{OUT}$ from the second level to the first level and maintains the output clock $CK_{OUT}$ at the first level. In this embodiment, the first level is a low level, and the second level is a high level, but the disclosure is not limited thereto. In other embodiments, the first level is a high level, and the second level is a low level.

Figure 5:
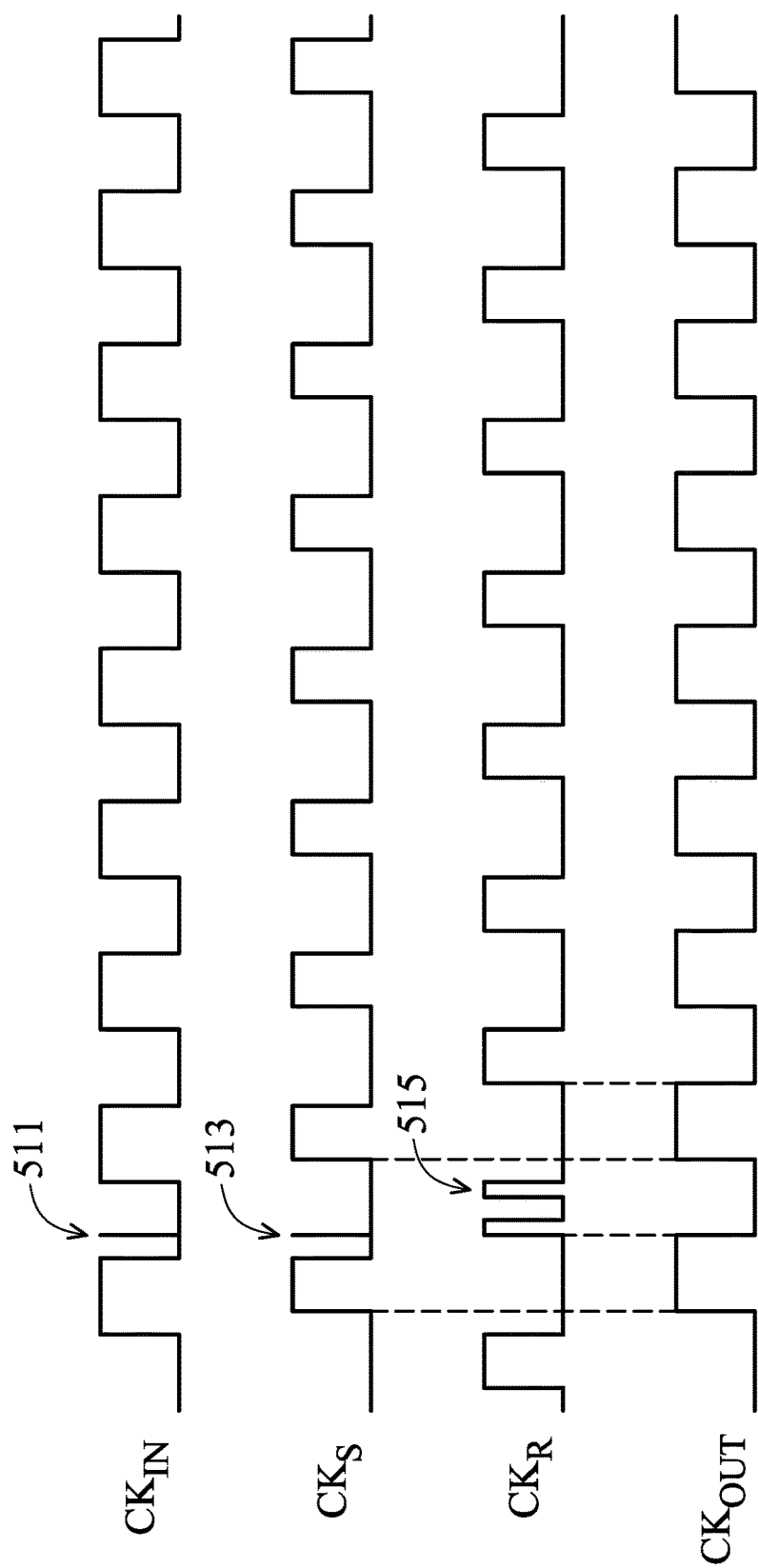
FIG. 5 is a schematic diagram of an exemplary embodiment of an output clock, according to various aspects of the present disclosure.

FIG. 5 is a schematic diagram of an exemplary embodiment of an output clock, according to various aspects of the present disclosure. When a glitch 511 occurs in the input clock $CK_{IN}$, the glitch 511 causes glitches 513 and 515. In this case, even if the glitch 513 occurs in the set clock $CK_S$ and the glitch 515 occurs in the reset clock $CK_R$, since the setting circuit 150 sets and maintains the output clock $CK_{OUT}$ at a high level according to the rising edge of the set clock $CK_S$ and sets and maintains the output clock $CK_{OUT}$ at a low level according to the rising edge of the reset clock $CK_R$, the output clock $CK_{OUT}$ is not interfered with the glitches 513 and 515.

Figure 6:
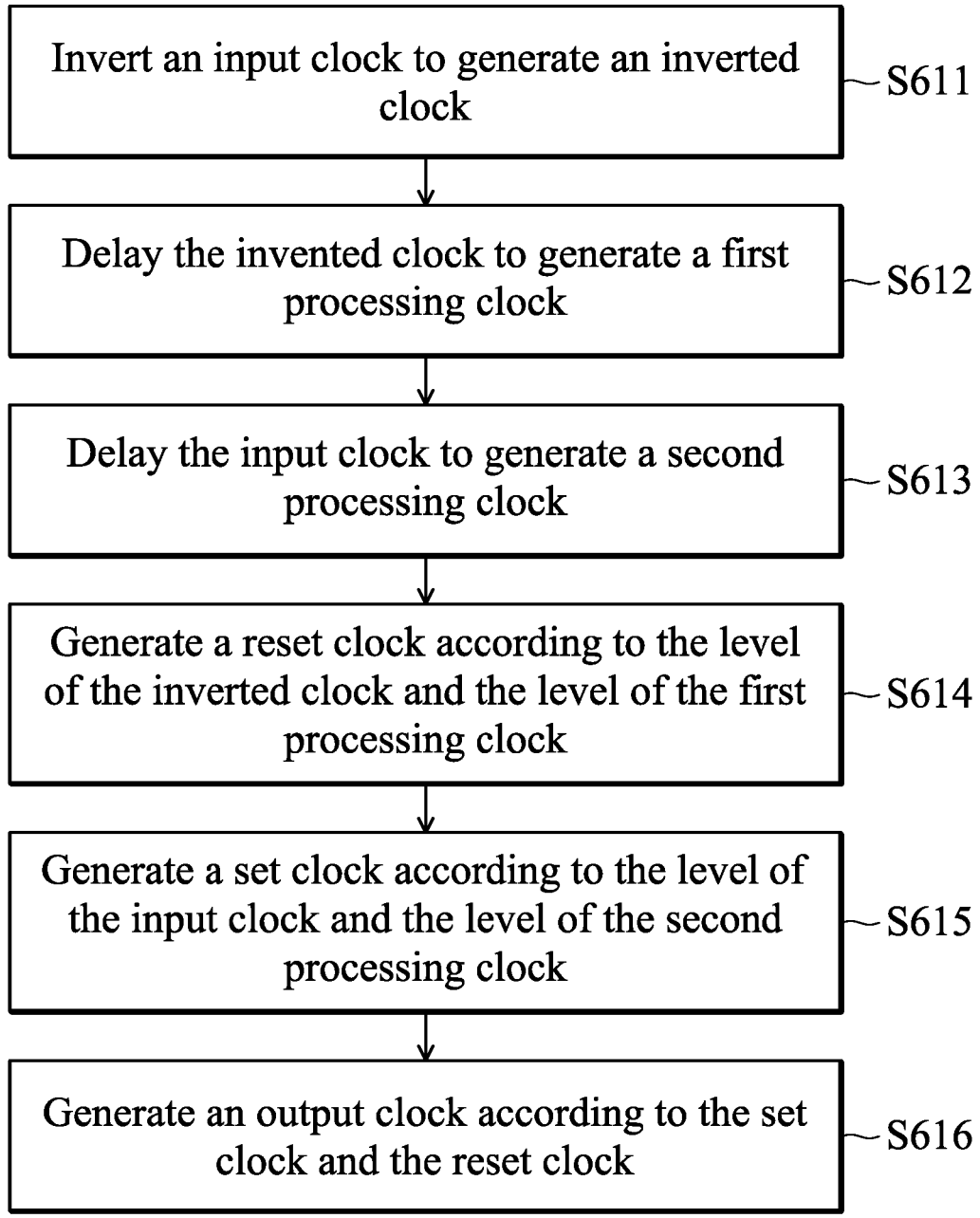
FIG. 6 is a flowchart of an exemplary embodiment of a clock filter method, according to various aspects of the present disclosure.

FIG. 6 is a flowchart of an exemplary embodiment of a clock filter method, according to various aspects of the present disclosure. The clock filter method is to filter the glitch of an input clock and generate an output clock. First, an input clock is inverted to generate an inverted clock (step S611). Then, the invented clock is delayed to generate a first processing clock (step S612). In this embodiment, the first processing clock lags the input clock, and time difference between the first processing clock and the inverted clock is equal to a first delay time. In one embodiment, the first delay time is less than or equal to a half cycle of the input clock.

The input clock is delayed to generate a second processing clock (step S613). In one embodiment, step S613 first delays the input clock to generate a delayed clock and then buffers the delayed clock to generate the second processing clock. In this embodiment, the second processing clock lags the input clock, and the time difference between the second processing clock and the input clock is equal to a second delay time. In one embodiment, the second delay time is equal to the first delay time. In another embodiment, step S613 first buffers the input clock to generate a buffered clock and then delays the buffered clock to generate the second processing clock. In this case, the time difference between the second processing clock and the buffered clock is equal to a third delay time. In one embodiment, the third delay time is less than or equal to a half cycle of the input clock. In another embodiment, the third delay time is equal to the first delay time. In other embodiments, the third delay time is equal to a quarter cycle of the input clock.

A reset clock is generated according to the level of the inverted clock and the level of the first processing clock (step S614). In one embodiment, when the inverted clock or the first processing clock is at a first level (e.g. a low level), the reset clock is at the first level. However, when each of the inverted clock and the first processing clock is at a second level (e.g. a high level), the reset clock is at the second level.

A set clock is generated according to the level of the input clock and the level of the second processing clock (step S615). In one embodiment, when the input clock or the second processing clock is at a first level (e.g. a low level), the set clock is at the first level. When each of the input clock and the second processing clock is at a second level (e.g. a high level), the set clock is at the second level.

An output clock is generated according to the set clock and the reset clock (step S616). In one embodiment, when the set clock is changed from a first level (e.g. a low level) to a second level (e.g. a high level), the output clock is at the second level. When the reset clock is changed from the first level to the second level, the output clock is at the first level.

Clock filter methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A clock filter for filtering a glitch of an input clock to generate an output clock and comprising:
    a first delay circuit inverting the input clock to generate an inverted clock and delaying the inverted clock to generate a first processing clock;
    a second delay circuit delaying the input clock to generate a second processing clock;
    a first setting circuit generating a reset clock according to the inverted clock and the first processing clock;
    a second setting circuit generating a set clock according to the input clock and the second processing clock; and
    a third setting circuit generating the output clock according to the set clock and the reset clock, wherein in response to the set clock changing from a first level to a second level, the third setting circuit sets the output clock to the second level, and in response to the reset clock changing from the first level to the second level, the third setting circuit sets the output clock to the first level.

2. The clock filter as claimed in claim 1, wherein the first delay circuit has a first delay time, the second delay circuit has a second delay time, and the first delay time is equal to the second delay time.

3. The clock filter as claimed in claim 1, wherein the first delay circuit comprises:
    an inverter inverting the input clock to generate the inverted clock; and
    a first delayer delaying the inverted clock to generate the first processing clock.

4. The clock filter as claimed in claim 3, wherein the second delay circuit comprises:
    a buffer receiving the input clock to generate a buffered clock; and
    a second delayer delaying the buffered clock to generate the second processing clock.

5. The clock filter as claimed in claim 4, wherein the first delayer has a first delay time, the second delayer has a second delay time, and each of the first and second delay times is less than or equal to a half cycle of the input clock.

6. The clock filter as claimed in claim 3, wherein the second delay circuit comprises:
    a second delayer delaying the input clock to generate a delayed clock; and
    a buffer buffering the delayed clock to generate the second processing clock.

7. The clock filter as claimed in claim 1, wherein in response to the inverted or the first processing clock being at the first level, the first setting sets the reset clock at the first level, and in response to the inverted clock and the first processing clock being at the second level, the first setting circuit sets the reset clock at the second level.

8. The clock filter as claimed in claim 7, wherein in response to the input clock or the second processing clock being at the first level, the second setting circuit sets the set clock at the first level, and in response to the input clock and the second clock being at the second level, the second setting circuit sets the set clock at the second level.

9. The clock filter as claimed in claim 1, wherein the third setting circuit is a SR flip-flop.

10. The clock filter as claimed in claim 1, wherein the third setting circuit comprises:
    a first NOR gate generating a logic signal according to the set clock and the output clock; and
    a second NOR gate generating the output clock according to the logic signal and the reset clock.

11. A clock processing method to filter a glitch of an input clock and generate an output clock, comprising:
    inverting the input clock to generate an inverted signal;
    delaying the inverted clock to generate a first processing clock;
    delaying the input clock to generate a second processing clock;
    generating a reset clock according to a level of the inverted clock and a level of the first processing clock;
    generating a set clock according to a level of the input clock and a level of the second processing clock; and
    generating the output clock according to the set clock and the reset clock,
    wherein in response to the set clock changing from a first level to a second level, the output clock is at the second level, and
    wherein in response to the reset clock changing from the first level to the second level, the output clock is at the first level.

12. The clock processing method as claimed in claim 11, wherein the first processing clock lags the inverted clock and a time difference between the first processing clock and the inverted clock is equal to a first delay time,
    wherein the second processing clock lags the input clock and a time difference between the second processing clock and the input clock is equal to a second delay time,
    wherein the first delay time is equal to the second delay time.

13. The clock processing method as claimed in claim 11, wherein the step of delaying the input clock to generate a second processing clock comprises:
    buffering the input clock to generate a buffered clock; and
    delaying the buffered clock to generate the second processing clock.

14. The clock processing method as claimed in claim 13, wherein a time difference between the first processing clock and the inverted clock is equal to the first delay time, a time difference between the second processing clock and the buffered clock is equal to the second delay time, and the first and second delay times are less than or equal to a half cycle of the input clock.

15. The clock processing method as claimed in claim 11, wherein in response to the inverted clock or the first processing clock being at the first level, the reset clock is at the first level, and in response to the inverted clock and the first processing clock being at the second level, the reset clock is at the second level.

16. The clock processing method as claimed in claim 15, wherein in response to the input clock or the second processing clock being at the first level, the set clock is at the first level, and in response to the input clock and the second processing clock being at the second level, the set clock is at the second level.

* * * * *